United States Patent
Shoji et al.

(10) Patent No.: US 8,752,754 B2
(45) Date of Patent: Jun. 17, 2014

(54) APPARATUS FOR ADHERING SOLDER POWDER AND METHOD FOR ADHERING SOLDER POWDER TO ELECTRONIC CIRCUIT BOARD

(75) Inventors: Takashi Shoji, Chichibu (JP); Takekazu Sakai, Yokohama (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 13/522,547

(22) PCT Filed: Jan. 18, 2011

(86) PCT No.: PCT/JP2011/050769
§ 371 (c)(1),
(2), (4) Date: Jul. 17, 2012

(87) PCT Pub. No.: WO2011/090031
PCT Pub. Date: Jul. 28, 2011

(65) Prior Publication Data
US 2012/0292377 A1    Nov. 22, 2012

(30) Foreign Application Priority Data

Jan. 20, 2010 (JP) ................. 2010-010270

(51) Int. Cl.
*B23K 31/02* (2006.01)
*B23K 1/06* (2006.01)
(52) U.S. Cl.
USPC ............. 228/122.1; 228/123.1; 228/124.1; 228/124.5; 228/178; 228/179.1
(58) Field of Classification Search
USPC ............ 228/122.1, 123.1, 124.1, 124.5, 178, 228/179.1
See application file for complete search history.

(56) References Cited

U.S. PATENT DOCUMENTS 5,527,628 A * 6/1996 Anderson et al. ............. 428/647
(Continued)

FOREIGN PATENT DOCUMENTS

| EP | 1 016 467 A2 | 7/2000 |
| EP | 1 120 889 A2 | 8/2001 |

(Continued)

OTHER PUBLICATIONS

International Search Report of PCT/JP2011/050769 dated Apr. 26, 2011.
(Continued)

*Primary Examiner* — Erin Saad
(74) *Attorney, Agent, or Firm* — Sughrue Mion, PLLC (57) ABSTRACT

Disclosed are an apparatus for adhering solder powder to finely adhere the solder powder to an electronic circuit board and a method for adhering solder powder to the electronic circuit board. The apparatus for adhering solder powder includes a container that contains an electronic circuit board and solder powder; a board holding portion provided in the container to hold the electronic circuit board such that a board surface thereof substantially faces a vertical direction; a tilting device which sets an initial position of the container as a tilted position where the container is tilted in a first direction, and which tilts the container from the initial position in a second direction that is opposite to the first direction, and tilts the container back in the first direction; and a vibrating device provided with an eccentric motor provided in the center of a bottom portion of the container which provides vibration to the bottom portion of the container through rotation of a rotating shaft, and control device for setting the rotating shaft of the eccentric motor in the same direction as the tilting direction of the container.

10 Claims, 4 Drawing Sheets

(56) References Cited

U.S. PATENT DOCUMENTS

| | | | |
|---|---|---|---|
| 2003/0209585 A1* | 11/2003 | Katayama | 228/41 |
| 2005/0040528 A1 | 2/2005 | Hazeyama et al. | |
| 2005/0274770 A1* | 12/2005 | Henderson | 228/41 |
| 2009/0056977 A1 | 3/2009 | Shoji et al. | |
| 2009/0261148 A1* | 10/2009 | Shoji et al. | 228/203 |
| 2010/0200284 A1* | 8/2010 | Seki et al. | 174/260 |

FOREIGN PATENT DOCUMENTS

| | | |
|---|---|---|
| EP | 1 864 750 A1 | 12/2007 |
| EP | 2 017 031 A1 | 1/2009 |
| JP | 06-344132 A | 12/1994 |
| JP | 07-007244 A | 1/1995 |
| JP | 07-074457 A | 3/1995 |
| JP | 2003-332375 A | 11/2003 |
| JP | 2004-087756 A | 3/2004 |
| JP | 2006-278650 A | 10/2006 |
| JP | 2007-149818 A | 6/2007 |
| WO | 2005/109977 A1 | 11/2005 |
| WO | 2007/116990 A1 | 10/2007 |

OTHER PUBLICATIONS

Extended European Search Report dated Jul. 30, 2013 issued in corresponding European Application No. 11734637.9.

* cited by examiner

APPARATUS FOR ADHERING SOLDER POWDER AND METHOD FOR ADHERING SOLDER POWDER TO ELECTRONIC CIRCUIT BOARD

TECHNICAL FIELD

The present invention relates to an apparatus for adhering solder powder for finely adhering the solder powder to an electronic circuit board and a method for adhering solder powder to the electronic circuit board.

Priority is claimed on Japanese Patent Application No. 2010-010270 filed in the Japan Patent Office on Jan. 20, 2010, the contents of which are incorporated herein by reference.

BACKGROUND ART

Recently, electronic circuit boards, which are obtained by forming electronic circuit patterns on insulating substrates, such as electronic circuit boards, plastic substrates (including films), ceramic substrates, or insulated substrate in which metal substrates or the like are coated with plastic or the like, have been developed. Further, accompanying this, device for forming electronic circuits using solder bonding of electronic components, such as IC devices, semiconductor chips, resistors, and capacitors, or the like on such circuit patterns have been widely adopted.

In the case of forming electronic circuits through such device, it is necessary to bond lead terminals of the electronic components to predetermined conductive circuit electrode surface portions of the circuit pattern in advance. As a general method thereof, a technique of printing solder paste or flux after forming a solder thin layer on the conductive circuit electrode surface of the electronic circuit board in advance has been known. Thereafter, by performing mount-positioning and reflow of predetermined electronic components, the lead terminals are solder bonded to the conductive circuit electrode surface portion.

Recently, with the miniaturization of electronic products, there has been a demand for fine pitching of an electronic circuit. For example, as fine pitch components in a small area, a QFP (Quad Flat Package) type LSI having a pitch of 0.3 mm, a CSP (Chip Size Package), an FC (Flip Chip) having a pitch of 0.15 mm, and the like, have been mounted. Because of this, the electronic circuit board requires a fine solder circuit pattern that can handle the fine pitch.

In the related art, as methods for forming a solder circuit composed of a solder film on an electronic circuit board, for example, a plating method, a HAL (Hot Air Leveler) method, a reflow method after printing solder powder paste, and the like, have been known. However, the method for manufacturing a solder circuit using plating makes it difficult to form the solder layer with a necessary thickness. Further, it is difficult to correspond to the fine pitch pattern with the method for printing a solder circuit using plating.

As a method for forming a solder circuit that can correspond to the fine pitch pattern corresponding to these related art methods, the use of a tackifier compound has been known (Patent Document 1). That is, by making the tackifier compounds react on the electronic circuit board, adhesion is imparted on the conductive circuit electrode surface. Through this, it is possible to adhere the solder powder to the conductive circuit electrode surface only. Thereafter, a fine solder circuit can be formed through heating of the electronic circuit board. According to this method, the fine solder circuit can be formed without the need for cumbersome operations such as alignment of the circuit pattern.

As a method for using the tackifier compound, a method in which the solder powder and the electronic circuit board are put inside a tank that is provided with a rotation and vibration device and rotated has been known.

According to this method, a method in which by rotating the tank through a rotating shaft placed in a center portion of the tank, the electronic circuit board is buried in the solder powder. Further, by making the rotating shaft of the tank substantially parallel to the electronic circuit board surface, the solder powder flows between electronic circuit boards, and thus respective electronic circuit boards are completely buried. Thereafter, by vibrating the tank through the rotating shaft, the solder powder is adhered to an adhesive portion of the electronic circuit board (Patent Document 2).

In addition, other than this method, a method for adhering solder powder to the adhesive portion through putting the electronic circuit board and the solder powder or solder suspension in a container and tilting the container has been known. In this method, the electronic circuit board is installed so that the electronic circuit board is parallel to the direction in which the solder powder or the solder suspension flows and the container is vibrated during tilting. Through this, the solder powder is adhered to the adhesive portion of the electronic circuit board (Patent Document 3).

Further, there has also been known a method for immersing the electronic circuit board in vibratable liquid after adhering the solder powder to the adhesive portion of the electronic circuit board (Patent Document 4). Through this, the solder powder that has been adhered to unnecessary positions can be removed. Because of this, it is possible to prevent a short circuit between adjacent circuit patterns.

[Patent Document 1] Japanese Unexamined Patent Application Publication No. 7-007244
[Patent Document 2] Japanese Unexamined Patent Application Publication No. 2003-332375
[Patent Document 3] Japanese Unexamined Patent Application Publication No. 2006-278650
[Patent Document 4] Japanese Unexamined Patent Application Publication No. 2007-149818

DISCLOSURE OF INVENTION

However, recently, with the miniaturization of the fine pitch pattern, the particle size of solder powder has also become smaller. Accordingly, in the methods of the related art, adhesion of solder powder to the adhesive portion has become difficult.

For example, if adhesion of solder powder having a particle size of about 10 µm is performed, the solder powder has a tendency to aggregate due to static electricity. Because of this, even if the container is tilted or rotated, the solder powder is moved while aggregating, and thus the adhesion of solder powder to the electronic circuit board has become insufficient. Further, due to the aggregation, the solder powder is not uniformly spread up to fine portions, and thus the adhesion of solder powder to the adhesive portion on the rear surface of the electronic circuit board has become insufficient.

Further, if the adhesion of solder powder is performed using the wet method, the frictional force between particles has become larger since the particle size of the powder is excessively small. Because of this, the solder suspension has a tendency to be solidified, and thus movement of the solder suspension is not sufficient even if the container is tilted or rotated. Further, since the solder suspension in a solidified state is moved on the electronic circuit board surface, the adhesion of solder powder to the adhesive portion has become insufficient.

Due to the miniaturization of the fine pitch pattern, the solder powder has a tendency to be adhered to unnecessary positions of the electronic circuit board. Further, since the fine solder powder has a tendency to aggregate, it has a tendency to adhere excess solder powder to the electronic circuit board. Accordingly, during reflow, the solder between the adjacent circuit patterns is melted, and thus a short circuit has a tendency to occur.

In order to remove the excess solder powder, since the conventional removal methods is insufficient, a separate process have to be adopted. Because of this, it is difficult to efficiently prevent short circuit.

The present invention has been made in view of the above-described problems, and an object of the invention is to provide an apparatus for adhering solder powder to an electronic circuit board having a fine pitch pattern and a method for adhering solder powder to the electronic circuit board.

In order to achieve the above object, the present invention provides the following device.

[1] An apparatus for adhering solder powder including: a container that contains an electronic circuit board and solder powder; a board holding portion provided in the container to hold the electronic circuit board such that a board surface thereof substantially faces a vertical direction; a tiling device which sets an initial position of the container as a tilted position where the container is tilted in a first direction, and which tilts the container from the initial position in a second direction that is opposite to the first direction, and tilts the container back in the first direction; and a vibrating device provided with an eccentric motor provided in the center of a bottom portion of the container which provides vibration to the bottom portion of the container through rotation of a rotating shaft, and control device for setting the rotating shaft of the eccentric motor in the same direction as the tilting direction of the container.

[2] The apparatus for adhering solder powder as described in [1], wherein the vibrating device has a function of vibrating the container when the tilting device tilts the container.

[3] The apparatus for adhering solder powder as described in [1] or [2], wherein the tilting device controls a tilting angle to an arbitrary value.

[4] The apparatus for adhering solder powder as described in any one of [1] to [3], wherein the control device controls an amplitude and a frequency of the eccentric motor to arbitrary values, respectively.

[5] The apparatus for adhering solder powder as described in [4], wherein the frequency is in the range of 0.5 Hz to 100 kHz.

[6] The apparatus for adhering solder powder as described in any one of [1] to [5], wherein a plurality of eccentric motors are provided and are all rotated in the same direction.

[7] The apparatus for adhering solder powder as described in any one of [1] to [6], wherein the board holding portion is configured to hold a plurality of electronic circuit boards.

[8] The apparatus for adhering solder powder as described in any one of [1] to [7], wherein the holding portion is composed of an elastic body.

[9] The apparatus for adhering solder powder as described in any one of [1] to [8], wherein a lid is installed on the container and the inside of the container has a sealed space.

[10] A method for adhering solder powder to an adhesive portion of an electronic circuit board including: a preparation step of placing the solder powder on one side of the inside of a container and making a board holding portion inside the container hold the electronic circuit board such that a board surface thereof faces substantially a vertical direction; a first step of setting a tilted position where the container is tilted in a first direction as an initial position of the container, and tilting the container from the initial position to a second direction that is opposite to the first direction using a tilting device; and a second step of tilting the container again in the first direction.

[11] The method for adhering solder powder as described in [10], wherein in the second step, the tilt in the first direction is performed at a tilting angle larger than a tilting angle in the second direction.

[12] The method for adhering solder powder as described in [10] or [11], wherein in the first step and the second step, a plurality of eccentric motors are used to be rotated in the same direction.

[13] The method for adhering solder powder as described in any one of [10] to [12], wherein in the first step and the second step, an angle of tilting is controlled to be an arbitrary value by the tilting device.

[14] The method for adhering solder powder as described in any one of [10] to [13], wherein in the first step and the second step, an amplitude and a frequency of the eccentric motor are respectively controlled to be arbitrary values by control device.

[15] The method for adhering solder powder as described in [14], wherein the frequency is in the range of 0.5 Hz to 100 kHz.

[16] The method for adhering solder powder as described in [14], wherein in the preparation step, a lid is installed on the container and a sealed space inside the container is filled with an inert gas.

[17] The method for adhering solder powder as described in any one of [10] to [16], wherein a particle size of solder powder is in the range of 4 µm to 20 µm.

[18] The method for adhering solder powder as described in [17], wherein a particle size of solder powder is in the range of 5 µm to 10 µm.

According to the apparatus for adhering solder powder and the method for adhering solder powder to the electronic circuit board according to the present invention, the container that contains the electronic circuit board and the solder powder can be tilted at an arbitrary tilting angle. Further, since the control device of the eccentric motor links with the tilting device, the rotating direction of the rotating shaft of the eccentric motor has become the same as the tilting direction of the container. Through this, as the container is tilted, it is possible to vibrate the bottom portion of the container at an angle perpendicular to the bottom portion.

Through this, even the fine solder powder can be prevented from aggregating or being solidified, and is able to flow to match the tilt of the container. Through this, the solder powder is uniformly spread up to the fine portions, and thus can be sufficiently adhered to the surface between the electronic circuit board and the bottom portion of the container.

Further, according to the present invention, it is possible to provide vibration to an area just below the electronic circuit board at an angle perpendicular to the area using the eccentric motor. Because of this, the solder powder is pushed up from the bottom to move in a jumping manner, and thus collides with the electronic circuit board at an angle perpendicular to the electronic circuit board and is effectively adhered to the adhesive portion.

Further, by tilting the electronic circuit board to the first direction at a tilting angle larger than the tilting angle to the second direction after adhering the solder powder through the tilt from the first direction to the second direction, the solder power adhered at positions and excess solder powder can be efficiently removed.

Accordingly, the electronic circuit board having a fine pitch pattern can be efficiently manufactured. Further, the short circuit between the adjacent circuit patterns due to the molten solder can be effectively prevented. Through this, the reliability of the electronic circuit board can be improved, and it is possible to achieve the miniaturization of the electronic circuit board. As a result, an electronic device having excellent characteristics can be provided.

DETAIL DESCRIPTION OF THE INVENTION

Hereinafter, the configuration of an apparatus 100 for adhering solder powder will be described in detail using FIG. 1A. For convenience, the drawings that are referred to in the following description may show characteristic portions in an enlarged manner, and the dimensions and proportions of the respective constituent elements in the drawings are not limited to the same as the actual dimensions and proportions thereof. Further, in the following description, the materials and dimensions described are merely exemplary, and the present invention is not limited thereto, but can be implemented in diverse forms without changing the scope of the invention.

The apparatus 100 for adhering solder powder according to this embodiment is schematically composed of a container 1, a board holding portion (not illustrated) for holding the electronic circuit board 10, a vibrating device 3, and a tilting device 4.

Hereinafter, the respective configurations will be described.

(Container 1)

Figure 1A:
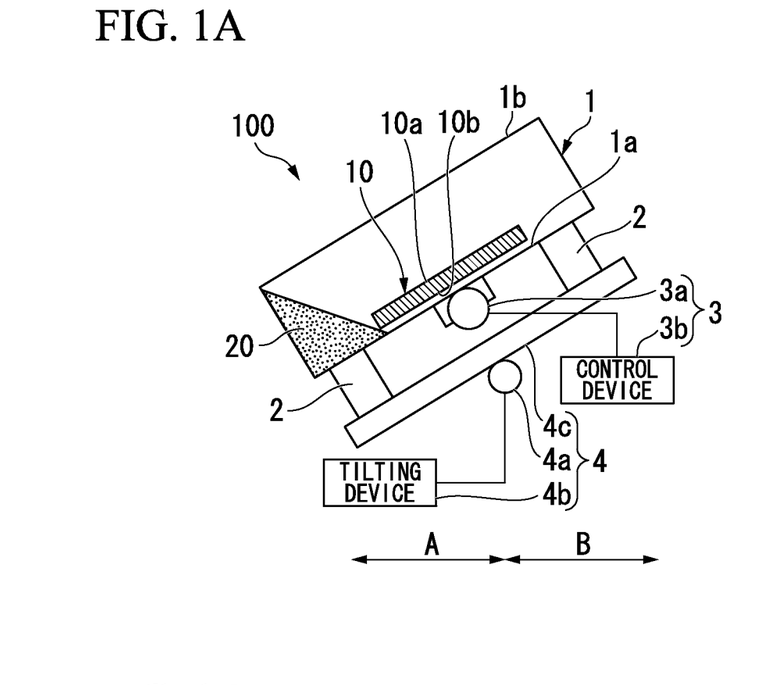
FIG. 1A is a process cross-sectional view illustrating an example of a manufacturing process of a method for adhering solder powder according to the present invention.

As illustrated in FIG. 1A, a lid 1b is provided on an upper portion of the container 1, and through fitting the lid 1b and the container 1, a sealed space is formed in the inside of the container 1 and the lid 1b. Further, the lid 1b is configured to be capable of opening and closing, and solder powder 20 can be accommodated inside the container 1 through the opening portion. Further, the container 1 is configured to be capable of accommodating a board holding portion to be described later and the electronic circuit board 10 positioned therein. Further, in a position that corresponds to the center of a bottom portion 1a of the outside of the container 1, an eccentric motor 3a to be described later is provided.

(Board Holding Portion)

The board holding portion is provided in the container 1, and an existing one may be used if it is configured to hold a plurality of electronic circuit boards 10 so that the board surface thereof faces substantially the vertical direction. It is more preferable that the board holding portion hold the electronic circuit boards at intervals from a bottom portion 1a of the container 1. As such, for example, the board holding portion, which is composed of a holding plate of the electronic circuit board 10 wherein in the holding plate a portion corresponding to the portion of the electronic circuit board 10 has been punched, insert portions of the electronic circuit board 10, and a suppression portion of the electronic circuit board 10, may be used. Further, in the board holding portion, it is preferable that the suppression portion use small things, such as projections and pins, in such as way that it does not represent a major obstacle when the electronic circuit board 10 is inserted.

FIG. 1A shows the electronic circuit board 10 having an upper board surface side (one surface side 10a) that is toward the lid 1b of the container 1 and the other surface side 10b that is toward the bottom portion 1a of the container 1. As shown here, the electronic circuit board 10 is held to keep an interval between its other surface side 10b and the bottom portion 1a of the container 1. Further, the electronic circuit board 10 is arranged so that the lower board surface (the other surface side 10b) is kept parallel to the bottom portion 1a of the container 1.

Further, in the case where a plurality of electronic circuit boards 10 are held by the board holding portion, it is preferable that the electronic circuit boards 10 be arranged in parallel at predetermined intervals.

(Electronic Circuit Board 10)

The electronic circuit board 10 that is the subject of the present invention is, for example, in the configuration of a strip shape, and as its materials, a plastic substrate, a plastic film substrate, a glass cloth substrate, a paper epoxy resin substrate, a substrate obtained by laminating a metal plate on a ceramics substrate or the like, a single-sided circuit board obtained by forming a circuit pattern, using a conductive material such as metal, on an insulating substrate that is obtained by coating plastic or ceramics on a metal base, a double-sided circuit board, a multilayered circuit board, or a flexible circuit board may be used. In addition, it is also possible to adopt an IC substrate, a capacitor, a resistor, a coil, a barrister, a bare chip, a wafer, and the like.

On the surfaces (one surface side 10a and the other surface side 10b) of the electronic circuit board 10, for example, a circuit pattern (not illustrated) composed of copper or a copper alloy is formed. The conductive material that forms the circuit pattern is not limited thereto, and any other conductive material having an adhesive surface through a tackifier material to be described later may be used. Such a conductive material may be a material that includes Ni, Sn, Ni—Au, flash gold, Pd, Ag solder alloy, or the like.

On the surface of the circuit pattern, an adhesive portion (not illustrated) for adhering solder powder 20 is formed. This adhesive portion is formed by making tackifier compounds to be described later react on the circuit pattern portion.

As these tackifier compounds, naphthotriazole-based derivatives, benzotriazole-based derivatives, imidazole-based derivatives, benzoimidazole-based derivatives, mercaptobenzothiazole-based derivatives, or benzothiazolthio fatty acids derivatives may be used. Although the tackifier compound has a strong effect particularly against copper, it may impart adhesion even to other conductive materials.

(Vibrating Device 3)

The vibrating device 3 is composed of an eccentric motor 3a and control device 3b.

The eccentric motor 3a is provided in a position corresponding to the center of the bottom portion 1a on the outside of the container 1. The rotating direction, amplitude, and frequency of the rotating shaft of the eccentric motor 3a are controlled by the control device 3b to be described later. In this embodiment, the rotating shaft of the eccentric motor 3a is controlled to be rotated in the same direction as the tilting direction of the container 1 by the control device 3b, and the rotating direction of the rotating shaft is changed depending on the tilting direction of the container 1.

Although it is good if one eccentric motor 3a is provided in the position corresponding to the center of the bottom portion 1a on the outside of the container 1, a plurality of eccentric motors 3a may be provided. In this case, it is preferable that all the eccentric motors 3a be controlled to be rotated in the same direction by the control device 3b. Further, it is preferable that the plurality of eccentric motors 3a be arranged at equal intervals in a position corresponding to just below of the board holding portion. Accordingly, the plurality of eccentric motor 3a can uniformly provide vibration to the bottom portion 1a at an angle perpendicular to the bottom portion 1a.

The control device 3b is device for controlling the rotating direction, the amplitude, and the frequency of the eccentric motor 3a. The control device 3b links with the tilting device 4 to be described later, and controls the rotating direction of the rotating shaft of the eccentric motor 3a according to the tilt of the container 1. Through this, the rotating shaft of the eccentric motor 3a is controlled to be rotated in the same direction as the tilting direction of the container 1. Accordingly, the eccentric motor 3a is configured to provide vibration to the bottom portion 1a of the container 1 at an angle perpendicular to the bottom portion 1a of the container 1.

Further, the amplitude and the frequency of the rotating shaft of the eccentric motor 3a may be optionally set depending on the state of solder powder 20, and although it is good if the settable frequency is in the range of 50 Hz to 60 Hz, it is preferable that the frequency is in the range of 0.5 Hz to 100 kHz. If the frequency is lower than 0.5 Hz, the vibration effect is unable to be obtained, while if the frequency exceeds 100 kHz, the amplitude has become lower and thus it has become difficult to move the solder powder 20 and as a result, unfavorable results are obtained.

(Tilting Device 4)

As illustrated in FIG. 1A, the tilting device 4 is provided on the outside of the container 1. The tilting device 4 is composed of, for example, a tilting shaft 4a, tilting device 4b, and a tilting plate 4c, and among them, the tilting plate 4c is configured to be connected to the container 1 by holding portions 2 to be described later. The configuration of the tilting device 4 is not limited to that described herein, and may be in other configurations as long as it is possible to tilt the container 1.

The tilting device 4 shown herein is provided on the outside or the lower portion of the container 1, and is configured to be connected to the container 1 through the holding portions 2 to be described later. The tilting device 4b is provided with, for example, a drive motor (not illustrated), and is configured to rotate the tilting shaft 4a. Since the tilting shaft 4a and the tilting plate 4c are connected to each other, the tilting plate 4c is tilted as the tilting shaft 4a is rotated. Through this, the tilting plate 4c is tilted in the first direction A or the second direction B at a certain tilting angle set by the tilting device 4b. Further, the tilting plate 4c is connected to the container 1 through the holding portions 2. Through this, the container 1 is configured to link with the tilting of the tilting plate 4c.

Here, it is preferable that the holding portion 2 is composed of, for example, an elastic body such as a spring. The holding portion 2 composed of the elastic body may stretch under the weight caused by the tilt of the container 1. Through this, in the tilting process, it is possible to mitigate the flow of solder powder 20 and the conflict into the container 1 of solder powder 20. Further, the holding portion 2 is not limited to the spring, and may be configured out of the spring as long as it is an elastic body that can hold the weight of the container 1.

Further, although not specially limited, it is preferable that the holding portions 2 be arranged at equal intervals while holding at least both ends of the bottom portion 1a of the container 1.

Through this configuration, the tilting device 4 can tilt the container 1 at a certain tilting angle. Further, it is also possible to optionally set the tilting angle depending on the tilting direction.

The apparatus 100 for adhering solder powder according to this embodiment may tilt the container 1 that contains the solder powder 20 and the electronic circuit board 10 at any tilting angle. Further, since the control device 3b of the eccentric motor 3a links with the tilting device 4, it is possible to make the rotating direction of the eccentric motor 3a be the same as the tilting direction of the container 1.

Through this, it is possible to provide vibration to the bottom portion 1a of the container 1 at an angle perpendicular to the bottom portion 1a depending on the tilt of the container 1.

Accordingly, by using the apparatus 100 for adhering solder powder according to this embodiment, even the fine solder powder 20 is prevented from aggregating during dry adhesion of solder powder 20 to the electronic circuit board 10. Further, during wet adhesion, solidification of the suspension (solder suspension) of solder powder 20 is prevented. That is, by using the apparatus 100 for adhering solder powder according to this embodiment, the solder powder 20 is able to flow in the container 1 in accordance with the tilt of the container 1. Through this, the solder powder 20 is uniformly spread up to the fine portion, and is further spread even between the other surface side 10b of the electronic circuit board 10 and the bottom portion 1a of the container 1. Due to this, the solder powder 20 can be adhered well to the adhesive portion of the other surface side 10b.

Further, the eccentric motor 3a according to this embodiment is configured to provide vibration to just below of the electronic circuit board 10 at the angle perpendicular to just below of the electronic circuit board 10. Because of this, the solder powder 20 is pushed up from the bottom to move in a jumping manner, and thus collides with the electronic circuit board 10 at the angle perpendicular to the electronic circuit board 10 to be effectively adhered to the adhesive portion.

Further, by tilting the electronic circuit board 10 in the opposite direction at a tilting angle larger than the tilting angle when the solder powder 20 is adhered after adhering the solder powder 20 and by adding the vibration through reversing of the eccentric motor 3a, the solder powder 20 adhered at unnecessary positions and excess solder powder 20 can be efficiently removed.

As described above, by using the apparatus 100 for adhering solder powder according to this embodiment, even the fine solder powder 20 can be easily fluidized and uniformly adhered to the adhesive portion of the electronic circuit board 10. Further, a separate process for removing the solder powder 20 has become unnecessary, and the number of tilts can be reduced. According to this method, it is good if the solder powder 20 makes at least one round trip in the container 1, and thus it is possible to simplify the process than the related art method. Further, since the apparatus 100 for adhering solder powder according to this embodiment can be horizontally arranged, it is possible to automate the process.

Accordingly, it is possible to efficiently manufacture the electronic circuit board 10 having the fine pitch pattern. Further, it is possible to effectively prevent the short circuit between the adjacent circuit patterns due to the molten solder. Through this, the reliability of the electronic circuit board 10 can be improved, and the miniaturization of the electronic circuit board 10 can be realized. Through this, it is possible to provide an electronic device having excellent properties.

Then, a method for adhering the solder powder 20 to the electronic circuit board 10 will be described with reference to FIGS. 1A to 1D and FIGS. 2A to 2C.

The method for adhering the solder powder 20 to the electronic circuit board 10 according to this embodiment schematically includes a step of forming an adhesive layer through coating of tackifier compounds on the surface of terminals on the electronic circuit board 10, a step of placing the solder powder 20 on one side of the inside of the container 1, a step (preparation step) of making the board holding portion in a position that faces the solder powder 20 inside the container 1 hold the electronic circuit board 10 such that the board surface of the electronic circuit board 10 faces substantially the vertical direction, a first step of setting a tilted position where the container 1 is tilted in the first direction A as an initial position of the container 1 and moving the solder powder 20 from the first direction A to the second direction B inside the container 1, and a second step of moving the solder powder 20 from the second direction B to the first direction A inside the container 1. In the following description, since the illustrated configurations are exemplary, the present invention is not limited to such configurations, and it is possible to carry out appropriate changes within a range that does not change the gist of the invention.

<Preparation Step>

The preparation step schematically includes the step of forming the adhesive layer through coating of the tackifier compounds on the surface of the terminals on the electronic circuit board 10, the step of placing the solder powder 20 on a predetermined position inside of the container 1, and the step of making the board holding portion in the position that faces the solder powder 20 inside the container 1 hold the electronic circuit board 10. Hereinafter, respective steps will be described in detail.

(Step of Forming the Adhesive Layer)

First, the surface of a conductive circuit electrode (not illustrated) of the electronic circuit board 10 is treated with the tackifier compounds.

First, the electronic circuit board 10 is prepared. The electronic circuit board 10 that is the subject of the present invention is, for example, in the configuration of a strip shape, and as its materials, a plastic substrate, a plastic film substrate, a glass cloth substrate, a paper epoxy resin substrate, a substrate obtained by laminating a metal plate on a ceramics substrate or the like, a single-sided circuit board obtained by forming a circuit pattern, using a conductive material such as metal, on an insulating substrate that is obtained by coating plastic or ceramics on a metal base, a double-sided circuit board, a multilayered circuit board, or a flexible circuit board may be used. In addition, it is also possible to adopt an IC substrate, a capacitor, a resistor, a coil, a barrister, a bare chip, a wafer, and the like.

On the surfaces (one surface side 10a and the other surface side 10b) of the electronic circuit board 10, for example, a circuit pattern (not illustrated) composed of copper or a copper alloy is formed. The conductive material that forms the circuit pattern is not limited thereto, and any other conductive material having an adhesive surface through a tackifier material to be described later may be used. As such a metal, a material that includes Ni, Sn, Ni—Au, flash gold, Pd, Ag solder alloy, or the like, may be provided.

Then, an adhesive layer is formed on the surface of a conductive circuit electrode (not illustrated) of the electronic circuit board 10. First, at least one kind or two or more kinds of tackifier compounds shown below are dissolved in water or acidic water, and an adhesive solution adjusted to slightly acidic is prepared. In this case, it is preferable that the hydrogen ion concentration index of the adhesive solution be about pH 3 to 4.

Then, the electronic circuit board 10 is immersed in the adhesive solution or the adhesive solution is coated on the electronic circuit board 10. Through this, the adhesive layer is formed on the circuit pattern of the electronic circuit board 10.

In this case, as the tackifier compounds, naphthotriazole-based derivatives, benzotriazole-based derivatives, imidazole-based derivatives, benzoimidazole-based derivatives, mercaptobenzothiazole-based derivatives, or benzothiazolthio fatty acids may be used. Although the tackifier compound has a strong effect particularly against copper, it may impart adhesion even to other conductive materials.

Further, according to the present invention, benzotriazole-based derivatives represented by a general formula (1) can be suitably used. However, R1 to R4 in the general formula (1) independently represent a hydrogen atom, an alkyl group or an alkoxy group in each of which the number of carbon atoms is 1 to 16 (preferably, 5 to 16), F, Br, Cl, I, a cyano group, an amino group, or an OH group.

[Chem. 1]

(1)

Further, according to the present invention, naphthotriazole-based derivatives represented by a general formula (2) can be suitably used. However, R5 to R10 in the general formula (2) independently represent a hydrogen atom, an alkyl group or an alkoxy group in each of which the number of carbon atoms is 1 to 16 (preferably, 5 to 16), F, Br, Cl, I, a cyano group, an amino group, or an OH group.

[Chem. 2]

(2)

Further, according to the present invention, imidazole-based derivatives represented by a general formula (3) can be suitably used. However, R11 and R12 in the general formula (3) independently represent a hydrogen atom, an alkyl group or an alkoxy group in each of which the number of carbon atoms is 1 to 16 (preferably, 5 to 16), F, Br, Cl, I, a cyano group, an amino group, or an OH group.

[Chem. 3]

(3)

Further, according to the present invention, benzoimidazole-based derivatives represented by a general formula (4) can be suitably used. However, R13 to R17 in the general formula (4) independently represent a hydrogen atom, an alkyl group or an alkoxy group in each of which the number of carbon atoms is 1 to 16 (preferably, 5 to 16), F, Br, Cl, I, a cyano group, an amino group, or an OH group.

[Chem. 4]

(4)

Further, according to the present invention, mercaptobenzothiazole-based derivatives represented by a general formula (5) can be suitably used. However, R18 to R21 in the general formula (5) independently represent a hydrogen atom, an alkyl group or an alkoxy group in each of which the number of carbon atoms is 1 to 16 (preferably, 5 to 16), F, Br, Cl, I, a cyano group, an amino group, or an OH group.

[Chem. 5]

(5)

Further, according to the present invention, benzothiazolthio fatty acid-based derivatives represented by a general formula (6) can be suitably used. However, R22 to R26 in the formula (6) independently represent a hydrogen atom, an alkyl group in which the number of carbon atoms is 1 to 16 (preferably, 1 to 2), an alkoxy group, F, Br, Cl, I, a cyano group, an amino group, or an OH group.

[Chem. 6]

(6)

Among these compounds, in the benzotriazole-based derivatives represented by the general formula (1), in general, adhesion has become stronger as the number of carbon atoms of R1 to R4 has become larger.

Further, even in the imidazole-based derivatives and the benzoimidazole-based derivatives represented in the general formula (3) and the general formula (4), in general, adhesion has become stronger as the number of carbon atoms of R11 to R17 has become larger.

Further, in the benzothiazolthio fatty acid-based derivatives represented in the general formula (6), it is preferable that the number of carbon atoms of R22 to R26 be 1 or 2.

As a substance used for pH adjustment of the adhesive solution, there may be mentioned inorganic acid, such as hydrochloric acid, sulfuric acid, nitric acid, or phosphoric acid. Further, as organic acid, formic acid, lactic acid, acetic acid, propionic acid, malic acid, oxalic acid, malonic acid, succinic acid, or tartaric acid, may be used. Here, the concentration of the tackifier compounds in the adhesive solution is not specially limited, but may be appropriately adjusted and used depending on solubility and the usage. In this case, it is preferable that the concentration of the tackifier compounds be totally in the range of 0.05 wt % to 20 wt %. Further, if the concentration is lower than 0.05 wt %, the tackifier compounds are unable to provide sufficient adhesion to cause unfavorable results.

It is preferable that the processing temperature when the adhesive solution is adhered to the conductive circuit electrode be set to be slightly higher than the room temperature. Through this, the formation speed of the adhesive layer and the amount of formation become sufficient values. Although the optimum value of the processing temperature is changed depending on the concentration of the tackifier compounds or the kind of metal that forms the conductive circuit electrode, in general, the range of about 30° C. to 60° C. is suitable. Further, it is preferable that the immersion time to the adhesion solution be in the range of about 5 seconds to 5 minutes. Because of this, it is preferable to adjust other conditions so that the immersion time is within this range.

Further, it is preferable to make copper ions coexist at 50 to 1000 ppm in the adhesive solution. This is because, by making the copper ions coexist, the formation efficiency of the adhesive layer, such as the formation speed, the amount of formation, or the like, is increased.

(Step of Placing the Solder Powder 20 in the Container 1)

Then, the container 1 is tilted in the first direction A to open the cover 1b, and as shown in FIG. 1A, the solder power 20 is placed. Here, metal composition of solder powder 20 may be, for example, Sn—Pb system, Sn—Pb—Ag system, Sn—Pb—Bi system, Sn—Pb—Bi—Ag system, or Sn—Pb—Cd system. Further, from the viewpoint of Pb elimination in the recent industrial wastes, it is particularly preferable to use Sn—In system, Sn—Bi system, In—Ag system, In—Bi system, Sn—Zn system, Sn—Ag system, Sn—Cu system, Sn—Sb system, Sn—Au system, Sn—Bi—Ag—Cu system, Sn—Ge system, Sn—Bi—Cu system, Sn—Cu—Sb—Ag system, Sn—Ag—Zn system, Sn—Cu—Ag system, Sn—Bi—Sb system, Sn—Bi—Sb—Zn system, Sn—Bi—Cu—Zn system, Sn—Ag—Sb system, Sn—Ag—Sb—Zn system, Sn—Ag—Cu—Zn system, and Sn—Zn—Bi system, which do not include Pb.

Further, specific examples of the above-described metal composition, around the eutectic solder (hereinafter indicated as "63Sn/37Pb) composed of 63 wt % of Sn and 37 wt % of Pb, may be 62Sn/36Pb/2Ag, 62.6Sn/37Pb/0.4Ag, 60Sn/40Pb, 50Sn/50Pb, 30Sn/70Pb, 25Sn/75Pb, 10Sn/88Pb/2Ag, 46Sn/8Bi/46Pb, 57Sn/3Bi/40Pb, 42Sn/42Pb/14Bi/2Ag, 45Sn/40Pb/15Bi, 50Sn/32Pb/18Cd, 48Sn/52In, 43Sn/57Bi, 97In/3Ag, 58Sn/42In, 95In/5Bi, 60Sn/40Bi, 91Sn/9Zn, 96.5Sn/3.5Ag, 99.3Sn/0.7Cu, 95Sn/5Sb, 20Sn/80Au, 90Sn/10Ag, 90Sn/7.5Bi/2Ag/0.5Cu, 97Sn/3Cu, 99Sn/1Ge, 92Sn/7.5Bi/0.5Cu, 97Sn/2Cu/0.8Sb/0.2Ag, 95.5Sn/3.5Ag/1Zn, 95.5Sn/4Cu/0.5Ag, 52Sn/45Bi/3Sb, 51Sn/45Bi/3Sb/1Zn, 85Sn/10Bi/5Sb, 84Sn/10Bi/5Sb/1Zn, 88.2Sn/10Bi/0.8Cu/1Zn, 89Sn/4Ag/7Sb, 88Sn/4Ag/7Sb/1Zn, 98Sn/1Ag/1Sb, 97Sn/1Ag/1Sb/1Zn, 91.2Sn/2Ag/0.8Cu/6Zn, 89Sn/8Zn/3Bi, 86Sn/8Zn/6Bi, 89.1Sn/2Ag/0.9Cu/8Zn, and the like. Further, as the solder powder 20 used in the present invention, solder powder in which two or more kinds of solder powders of different compositions are mixed may be used.

Further, the particle size of solder powder 20 is preferably in the range of 4 μm to 20 μm, and more preferably, in the range of 5 μm to 10 μm. The particle size of solder powder 20 is not specially limited to the above-described values, but may be larger than the above-described values.

Further, the tilting angle of the container 1 at this time may be appropriately set depending on the amount of solder powder 20 or the tilting angle in the first step to be described later.

Then, the solder powder 20 is placed on the side of the first direction A in the container 1. In this case, it is preferable that the solder powder 20 is not in contact with the board holding portion. The lid 1b is opened whenever the process of adhering the solder powder 20 to the electronic circuit board 10 is performed, and through the lid 1b, the solder powder 20 and the electronic circuit board 10 are put in or taken out from the container 1.

In the case of the wet adhesion of solder powder 20, dispersing liquid such as water is put into the container 1 through the tilt of the container 1, and then the solder powder 20 is added. Through this, the solder powder 20 is dispersed into the dispersing liquid to form a solder suspension.

In this embodiment, it is preferable to put the solder powder 20 into the container 1 earlier than putting of the electronic circuit board 10. Through this, in the process of holding the electronic circuit board 10 onto the board holding portion to be described later, scattering of solder powder 20 is suppressed even in the case of opening or closing the lid 1b.

(Step of Holding the Electronic Circuit Board 10 Through the Board Holding Portion)

Then, the electronic circuit board 10 is held by the board holding portion (not illustrated). The board holding portion is provided in the container 1, and even an existing one may be used if it is configured to hold a plurality of electronic circuit boards 10 so that the plurality of electronic circuit boards 10 are arranged at intervals from the bottom portion 1a of the container 1 and the board surface thereof faces substantially the vertical direction. Further, in the board holding portion, it is preferable that the suppression portion use small things, such as projections and pins, in such as way that it does not represent a major obstacle when the electronic circuit board 10 is inserted.

By holding the electronic circuit board 10 through the board holding portion, the side of the other surface 10b of the electronic circuit board 10 is held in parallel to the bottom portion 1a of the container 1 and at an interval with the bottom portion 1a.

In this case, it is assumed that the side of the lid 1b of the electronic circuit board 10 has become the side of one surface 10a, and the board surface of the side of the bottom portion 1a has become the side of the other surface 10b. In the case of holding a plurality of electronic circuit board 10 through the board holding portion, it is preferable that the electronic circuit boards 10 be arranged in parallel at predetermined intervals. Through this, the electronic circuit board 10 is configured to be arranged just above the eccentric motor 3a to be described later. As above, the electronic circuit board 10 is mounted parallel to the bottom portion 1a.

Here, when the electronic circuit board 10 is put into or taken out from the container 1, the solder powder 20 is stored in the lower portion of the container 1, and is placed separately from the lid 1b. Through this, when the lid 1b is opened or closed, the dispersion of solder powder 20 to the outside is suppressed.

Thereafter, the lid 1b is closed, and the sealed space inside the container 1 is filled with an inert gas, for example, such as $N_2$. In the subsequent step, the lid 1b is kept closed until the electronic circuit board 10 is taken out from the container 1. The reason why the container 1 is filled with an inert gas is to prevent the oxidization of solder powder 20.

<First Step>

Then, as shown in FIGS. 1A to 1D, the solder powder 20 is moved from the side of the first direction A to the side of the second direction B inside the container 1.

FIG. 1A illustrates a state where the solder powder 20 or the solder suspension and the electronic circuit board 10 are placed in the container 1. On the outside of the container 1, the vibrating device 3 composed of the eccentric motor 3a and the control device 3b is provided, and at least the eccentric motor 3a is provided in the center of the bottom portion 1a of the container 1.

The rotating direction, amplitude, and frequency of the rotating shaft of the eccentric motor 3a are controlled by the control device 3b. In this embodiment, the rotating shaft of the eccentric motor 3a is controlled to be rotated in the same direction as the tilting direction of the container 1, and the rotating direction of the rotating shaft is changed depending on the tilting direction of the container 1.

On the outside of the container 1, the tilting device 4 composed of the tilting shaft 4a, the tilting device 4b, and the tilting plate 4c is provided, and is configured to tilt the container 1 through the holding portions 2 to be described later. The tilting device 4b can optionally set the tilting angle.

First, the container 1 is tilted from the side of the first direction A to the side of the second direction B, for example, at an angle of 5° from the horizontal state. The tilting shaft 4a is first rotated by the drive motor (not illustrated) of the tilting device 4b. Through this, the tilting plate 4c that is bonded to the tilting shaft 4a is tilted on the side of the second direction B. At this time, the tilting plate 4c can be tilted at any angle set by the tilting device 4b.

Here, the container 1 is connected to the tilting plate 4c through the holding portion 2 composed of, for example, an elastic body such as a spring. Through this, the container 1 is tilted in association with the tilting plate 4c. Further, the holding portion 2 is not limited to the spring, and may be configured out of the spring as long as it is an elastic body that can hold the weight of the container 1. Further, the arrangement of the holding portion 2 is not specially limited, but it is preferable that the holding portion 2 is arranged at equal intervals while holding at least the both ends of the bottom portion 1a of the container 1.

In accordance with the tilt of the container 1, the tilting device 3 composed of the eccentric motor 3a and the control device 3b vibrates the bottom portion 1a of the container 1. The control device 3b links with the tilting device 4 to be described later, and is configured to control the rotating direction of the rotating shaft of the eccentric motor 3a depending on the tilt of the container 1.

Further, the rotating shaft of the eccentric motor 3a is controlled to be rotated in the same direction as the tilting direction of the container 1 through the control device 3b. Through this, the rotating direction of the rotating shaft of the eccentric motor 3*a* is changed depending on the tilting direction of the container 1 to provide vibration to the bottom portion 1*a* at an angle that is constantly perpendicular to the bottom portion 1*a*.

Because of this vibration, the solder powder 20 is pushed up from the bottom to move in a jumping manner. Accordingly, the aggregation of solder powder 20 is prevented, and the solder powder 20 is moved depending on the tilt of the container 1. Further, through this, the solder powder 20 is uniformly spread up to the fine portion, and thus further spread even between the side of the other surface 10*b* of the electronic circuit board 10 and the bottom portion 1*a* of the container 1. Through this, the solder powder 20 can be sufficiently adhered to the adhesive portion of the side of the other surface 10*b*.

Further, the solder powder 20 is pushed up from the bottom to move in a jumping manner, and thus collides with the electronic circuit board 10 at the angle perpendicular to the electronic circuit board 10 to be effectively adhered to the adhesive portion.

Further, in the case of using the solder suspension, the solder powder 20 is pushed up from the bottom to move in a jumping manner, and thus the solidification of the solder suspension is prevented. Through this, the solder suspension is liquefied and flows up to the fine portion depending on the tilt of the container 1. Further, since solder powder 20 collides with the electronic circuit board 10 at an angle perpendicular to the electronic circuit board 10, it is effectively adhered to the adhesive portion.

In this case, the amplitude and the frequency of the rotating shaft of the eccentric motor 3*a* may be optionally set depending on the state of solder powder 20. Although it is good if the settable frequency is in the range of 50 Hz to 60 Hz, it is preferable that the frequency is in the range of 0.5 Hz to 100 kHz. If the frequency is lower than 0.5 Hz, the vibration effect is unable to be obtained, while if the frequency exceeds 100 kHz, it has become difficult to move the solder powder 20 to cause unfavorable results.

Figure 1B:
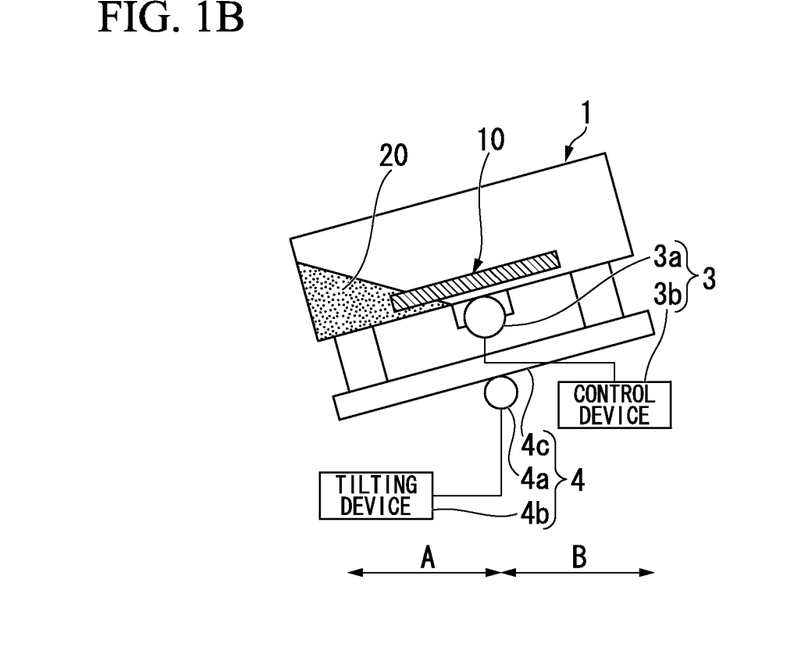
FIG. 1B is a process cross-sectional view illustrating an example of a manufacturing process of a method for adhering solder powder according to the present invention.
Figure 1C:
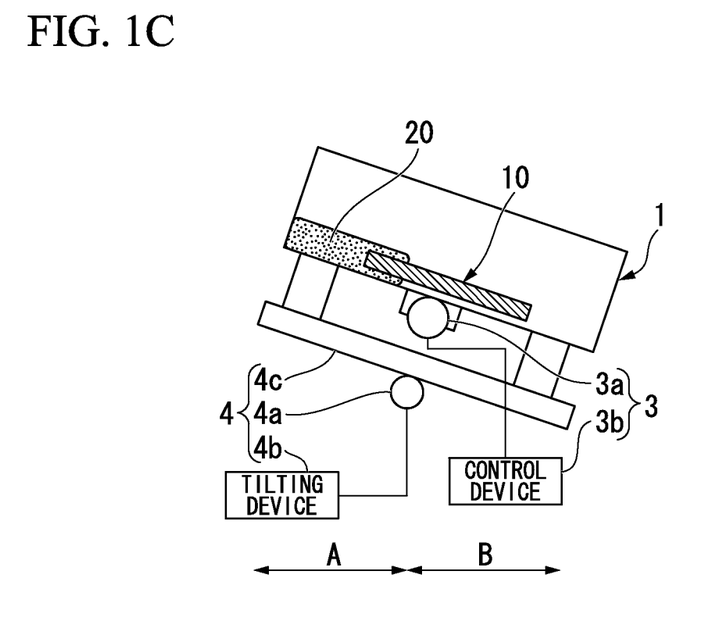
FIG. 1C is a process cross-sectional view illustrating an example of a manufacturing process of a method for adhering solder powder according to the present invention.

As shown in FIGS. 1B and 1C, the solder powder 20 is moved in contact with the surface of the electronic circuit board 10 and is adhered to the adhesive portion. Further, the amplitude and the frequency of the eccentric motor 3*a* may be optionally set depending on the moving state or jumping state of solder powder 20. Here, the frequency may be set to AC frequency of 50 Hz.

Although it is good if one eccentric motor 3*a* is provided in the position corresponding to the center of the bottom portion 1*a* on the outside of the container 1, a plurality of eccentric motors 3*a* may be provided. In this case, it is preferable that the eccentric motors 3*a* be controlled to be rotated in the same direction by the control device 3*b*. Further, it is preferable that the plurality of eccentric motors 3*a* be arranged at equal intervals in a position corresponding to just below of the board holding portion. Accordingly, the plurality of eccentric motor 3*a* can uniformly provide vibration to the bottom portion 1*a* at an angle perpendicular to the bottom portion 1*a*.

Figure 1D:
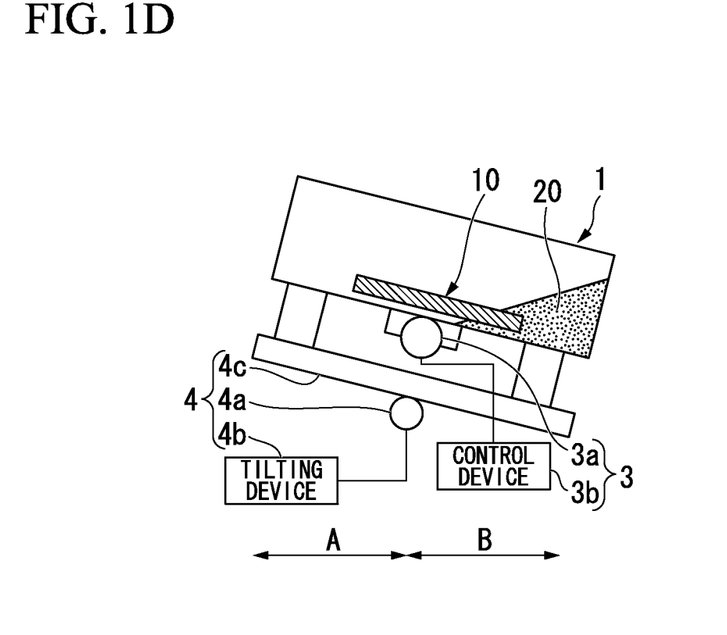
FIG. 1D is a process cross-sectional view illustrating an example of a manufacturing process of a method for adhering solder powder according to the present invention.

Thereafter, as shown in FIG. 1D, the solder powder 20 reaches the side wall of the side of the second direction B of the container 1 to finish the movement. At this time, the holding portion 2 stretches under the weight caused by the tilt of the container 1, and thus it is possible to mitigate the flow of solder powder 20 and the conflict into the container 1 of solder powder 20.

<Second Step>

Figure 2A:
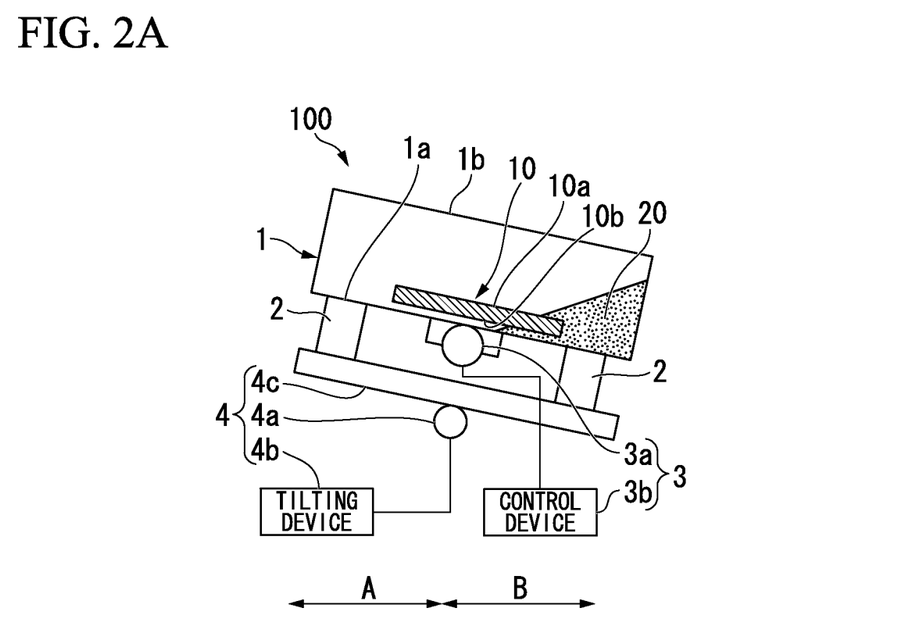
FIG. 2A is a process cross-sectional view illustrating an example of a manufacturing process of a method for adhering solder powder according to the present invention.
Figure 2B:
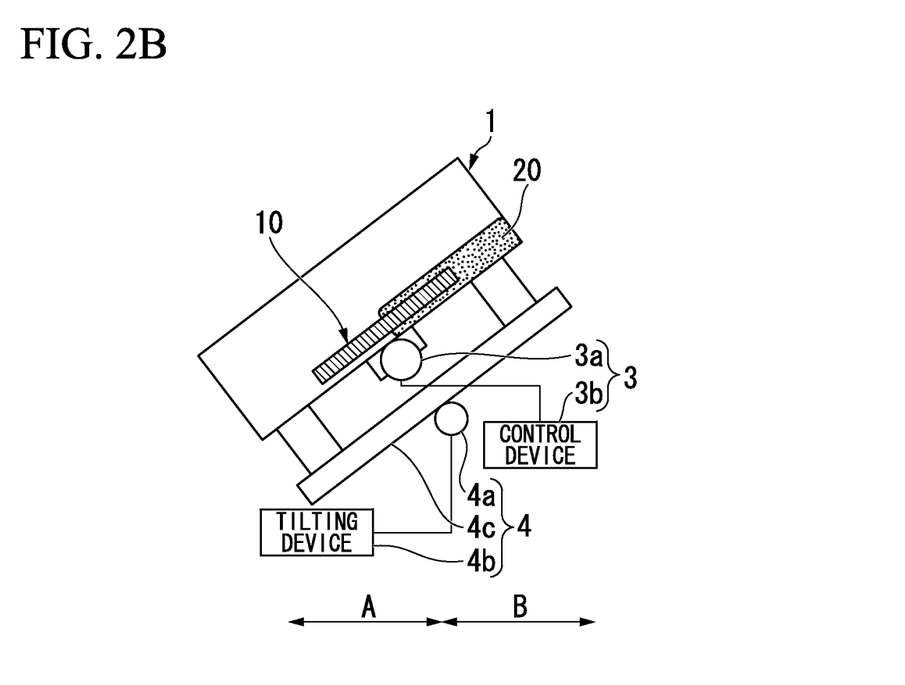
FIG. 2B is a process cross-sectional view illustrating an example of a manufacturing process of a method for adhering solder powder according to the present invention.
Figure 2C:
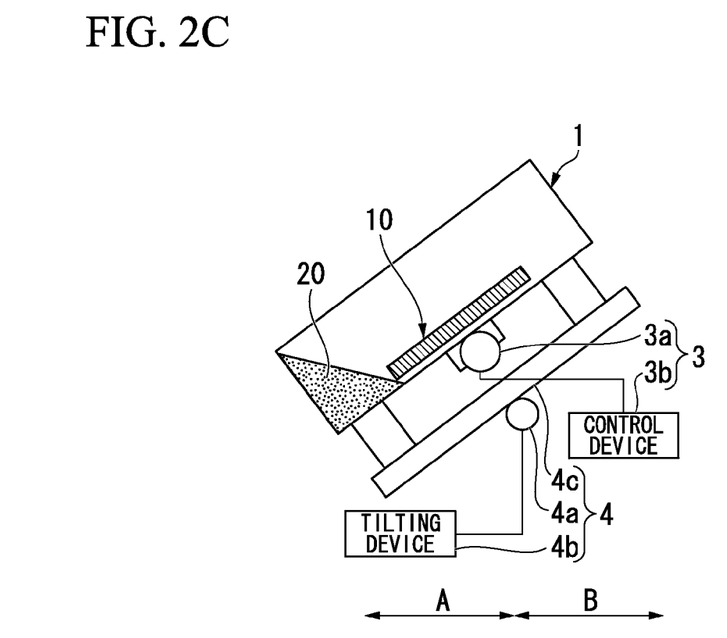
FIG. 2C is a process cross-sectional view illustrating an example of a manufacturing process of a method for adhering solder powder according to the present invention.

Then, as shown in FIGS. 2A to 2C, the solder powder 20 is moved from the side of the second direction B to the side of the first direction A inside the container 1. FIG. 2A illustrates a state after the first step, that is, a state where the solder powder 20 or the solder suspension and the electronic circuit board 10 are placed on the side of the second direction B in the container 1.

First, the container 1 is tilted to the side of the first direction A, for example, at an angle of 30° from the side of the horizontal state.

This tilt is performed in the opposite direction to the tilt in the first step. Further, it is preferable that this tilt is performed at a larger tilting angle than the tilt in the second direction B in the first step.

Further, in accordance with the tilt of the container 1, the tilting device 3 vibrates the bottom portion 1*a* of the container 1. The rotating shaft of the eccentric motor 3*a* is controlled to be rotated in the same direction as the second direction of the container 1 through the control device 3*b*. In this case, the first direction A is opposite to the second direction B. Through this, the eccentric motor 3*a* provides vibration to the bottom portion 1*a* at an angle perpendicular to the bottom portion 1*a*.

Because of this, the solder powder 20 is pushed up to move in a jumping manner, and is moved in accordance with the tilt of the container 1 as shown in FIG. 2B.

In this case, it is preferable that the tilt of the container 1 is performed at a larger tilting angle than the tilt of the container in the first step. Through this, the solder powder 20 adhered at unnecessary positions and the excess solder powder 20 is pushed up to move in a jumping manner due to the vibration and is moved in the first direction A in the container 1. Through this, the solder powder 20 adhered to positions other than the adhesive portion can be effectively removed.

As described above, the solder powder 20 can be effectively adhered to the adhesive portion of the electronic circuit board 10, and the adhesion of solder powder 20 to the unnecessary positions can be removed. Although it is good if the first step and the second step are performed at least once, the number of times to perform the steps may be appropriately adjusted depending on the adhesion state.

Further, the amplitude and the frequency of the eccentric motor 3*a* may be optionally set depending on the moving state or jumping state of solder powder 20. In the case where a plurality of eccentric motors 3*a* are provided, it is preferable that all the eccentric motors 3*a* be controlled to be rotated in the same direction through the control device 3*b*.

Thereafter, as shown in FIG. 2C, the solder powder 20 reaches the side wall in the first direction A of the container 1 to finish the movement.

Thereafter, the electronic circuit board 10 is manufactured by performing the steps of taking out the electronic circuit board 10 from the container 1, coating active agents including hydrogen halide acid salt of an organic acid base on the electronic circuit board 10, fixing the solder powder 20 through heating of the electronic circuit board 10 below the melting point of the solder, coating flux on the electronic circuit board 10, and dissolving the solder powder 20 through heating of the electronic circuit board 10.

According to the method for adhering the solder powder 20 to the electronic circuit board 10 according to this embodiment, the container 1 that contains the solder powder 20 and the electronic circuit board 10 can be tilted at any tilting angle. Further, the eccentric motor 3*a* can be rotated in the same direction as the tilting direction of the container 1. Through this, the vibration is able to be provided to the bottom portion 1*a* thereof at an angle perpendicular to the bottom portion 1*a* depending on the tilt of the container 1.

Through this, the solder powder 20 is pushed up to move in a jumping manner. Accordingly, even the fine solder powder 20 is prevented from aggregating, and even the suspension of solder powder 20 is prevented from being solidified. According to this embodiment, the solder powder 20 is uniformly spread in the container 1 to match the tilt of the container 1, and perpendicularly collides with the adhesive portion of the electronic circuit board 10. Accordingly, in the first step, the solder powder 20 can be adhered well to the fine portion of the adhesive portion, including the side of the other surface 10b of the electronic circuit board 10.

Further, in the second step, by tilting the container 1 at a larger tilting angle than that in the first step, it is possible to efficiently remove the solder powder 20 adhered to unnecessary positions and excess solder powder 20.

As described above, even the fine solder powder 20 can be uniformly adhered to the adhesive portion of the electronic circuit board 10. Further, a separate process for removing the solder powder 20 has become unnecessary, and the number of tilts can be reduced. According to this method, it is good if the solder powder 20 makes at least one round trip in the container 1, and thus it is possible to simplify the process than the related art method. Further, since the apparatus 100 for adhering solder powder according to this embodiment can be horizontally arranged, it is possible to automate the process.

Accordingly, it is possible to efficiently manufacture the electronic circuit board 10 having the fine pitch pattern. Further, it is possible to effectively prevent the short circuit between the adjacent circuit patterns due to the molten solder. Through this, the reliability of the electronic circuit board 10 can be improved, and the miniaturization of the electronic circuit board 10 can be realized. Through this, it is possible to provide an electronic device having excellent properties.

EXAMPLE

Hereinafter, examples of the present invention will be described, but the present invention is not limited thereto.

Example 1

First, an electronic circuit board 10 in the configuration of a strip shape and with a size of width 50 mm, length 200 mm, and thickness 0.4 mm was prepared. Further, the minimum width of the electrode of the electronic circuit board 10 was 20 μm and the minimum distance between the electrodes was 20 μm.

Then, the electronic circuit board 10 was preprocessed with hydrochloric acid with water. Then, 2 wt % water solution of imidazole compound, in which alkyl group of R12 is $C_{11}H_{23}$, and R11 is a hydrogen atom in the general formula (3) was prepared as the adhesive solution including the tackifier compound, and its pH was adjusted to about 4 through acetic acid. Then, the adhesive solution was heated at 40° C., and the electronic circuit board 10 was immersed for 3 minutes. Through this, adhesive layers were formed on electronic circuits on the side of one surface 10a and the side of the other surface 10b of the electronic circuit board 10.

Then, the container 1 with a size of length 200 mm, width 120 mm, and height 150 mm was tilted to the side of the first direction A to open the lid 1b. Then, from the opening of the lid 1b, about 400 g of solder powder 20 having composition of 96.5Sn/3.5Ag and a particle size of 5 μm was placed on the side of the first direction A in the container 1. At this time, the solder powder 20 was not in contact with the board holding portion (not illustrated). Then, 1600 ml water was put into the container 1 to form solder suspension of solder powder 20.

Then, the apparatus 100 for adhering the solder powder was prepared and held through the board support portion (not illustrated) in a manner that the side of one surface 10a of each of three electronic circuit boards 10 was directed upward (to the side of the lid 1b of the container 1), and the apparatus 100 was held at an interval with the bottom portion 1a. This state is shown in FIG. 1A.

Then, the tilting shaft 4a was driven by, for example, the drive motor (not illustrated) of the tilting device 4b. Through this, the container 1 was tilted to the side of the second direction B at a tilting angle of 5° from the horizontal state. Through this, the eccentric motor 3a was rotated in the same direction as the tilting direction of the container 1. Through this, vibration was provided to the bottom portion 1a at an angle perpendicular to the outside thereof. Further, the frequency of the eccentric motor 3a at this time was AC frequency of 50 Hz.

Then, the container 1 was tilted to the side of the first direction A at the tilting angle of 5° from the horizontal state. Through this, the eccentric motor 3a was rotated in the tilting direction of the container 1.

The tilt in the first direction A and the tilt in the second direction B were performed once. Further, their tilting period was 10 seconds.

Thereafter, the electronic circuit board 10 was taken from the container 1, lightly washed with pure water, and then dried.

Then, an activator was coated on both the side of one surface 10a and the side of the other surface 10b of the electronic circuit board 10.

Then, the electronic circuit board 10 was dried in air, put into an oven heated at 240° C., and then heated in air for one minute, so that the solder powder 20 was dissolved. Thereafter, the electronic circuit of the electronic circuit board 10 was checked, but any short circuit or omission was not found.

Comparative Example 1

Figure 3:
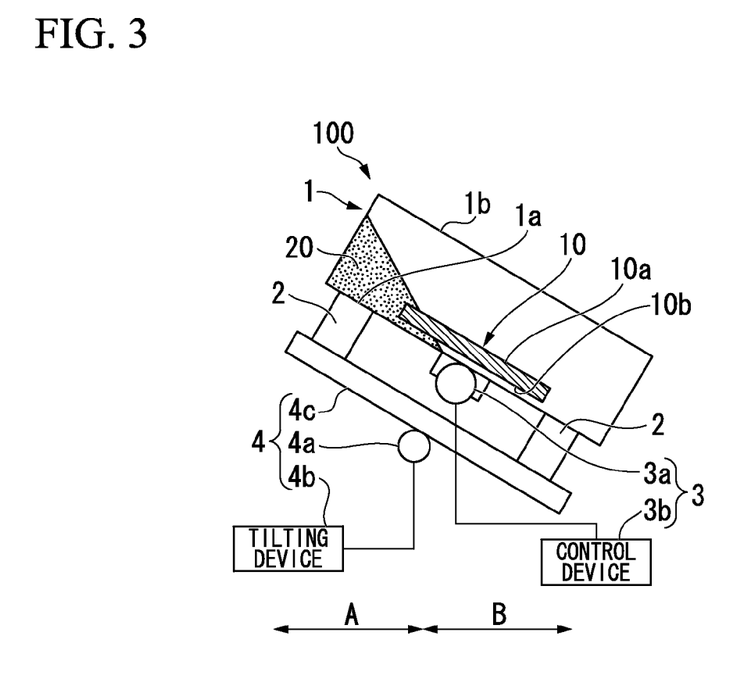
FIG. 3 is a process cross-sectional view illustrating an example of a manufacturing process in a method for adhering solder powder according to an example.

The same method as the example 1 was adopted except that the eccentric motor 3a was not rotated. However, as shown in FIG. 3, although the container 1 was tilted, the solder powder 20 was not sufficiently diffused. Thereafter, the electronic circuit was checked after manufacturing the electronic circuit board 10, and short circuit and omission were observed.

| DENOTATION OF REFERENCE NUMERALS | |
|---|---|
| 1: | CONTAINER |
| 1a: | BOTTOM PORTION |
| 1b: | LID |
| 2: | HOLDING PORTION |
| 3: | VIBRATING DEVICE |
| 3a: | ECCENTRIC MOTOR |
| 3b: | CONTROL DEVICE |
| 4: | TILTING DEVICE |
| 4a: | TILTING SHAFT |
| 4b: | TILTING DEVICE |
| 4c: | TILTING PLATE |
| 10: | ELECTRONIC CIRCUIT BOARD |
| 20: | SOLDER POWDER |
| 100: | APPARATUS FOR ADHERING SOLDER POWDER |
| A: | FIRST DIRECTION |
| B: | SECOND DIRECTION |

The invention claimed is:

1. A method for adhering solder powder to an adhesive portion of an electronic circuit board comprising:
a preparation step of placing the solder powder on one side of the inside of a container and making a board holding portion inside the container hold the electronic circuit board with the adhesive portion such that a board surface thereof faces substantially a vertical direction with respect to a bottom face of the container;

a first step of setting a tilted position where the container is tilted in a first direction as an initial position of the container, and tilting the container from the initial position to a second direction that is opposite to the first direction using a tilting device; and a second step of tilting the container again in the first direction, wherein at least one of the first step and the second step further comprises a step of rotating a rotating shaft of an eccentric motor of a vibrating device to cause vibration to a bottom portion of the container so that the solder powder moves to adhere to the adhesive portion of the electronic circuit board, wherein the vibrating device includes;

the eccentric motor provided in the center of the bottom face of the container, and a control device for setting the rotating shaft of the eccentric motor in the same direction as the tilting direction of the container, wherein in the step of rotating the rotating shaft of the eccentric motor of the vibrating device to cause vibration to the bottom portion of the container, the vibrating device vibrates the container when the tilting device tilts the container.

2. The method for adhering solder powder according to claim 1, wherein in the second step, the tilt in the first direction is performed at a tilting angle larger than a tilting angle in the second direction.

3. The method for adhering solder powder according to claim 1, wherein in the first step and the second step, a plurality of eccentric motors are used to be rotated in the same direction.

4. The method for adhering solder powder according to claim 1, wherein in the first step and the second step, an angle of tilting is controlled to be an arbitrary value by the tilting device.

5. The method for adhering solder powder according to claim 1, wherein in the first step and the second step, an amplitude and a frequency of the eccentric motor are controlled to be arbitrary values, respectively, by control device.

6. The method for adhering solder powder according to claim 5, wherein the frequency is in the range of 0.5 Hz to 100 kHz.

7. The method for adhering solder powder according to claim 1, wherein in the preparation step, a lid is provided on the container and a sealed space inside the container is filled with an inert gas.

8. The method for adhering solder powder according to claim 1, a particle size of the solder powder is in the range of 4 μm to 20 μm.

9. The method for adhering solder powder according to claim 8, wherein the particle size of the solder powder is in the range of 5 μm to 10 μm.

10. The method for adhering solder power according to claim 1, wherein the eccentric motor is configured to provide vibration to the bottom portion of the container at an angle perpendicular to the bottom face of the container.

* * * * *